United States Patent [19]

Shiraishi et al.

[11] Patent Number: 5,117,255
[45] Date of Patent: May 26, 1992

[54] PROJECTION EXPOSURE APPARATUS

[75] Inventors: Naomasa Shiraishi, Urawa; Tetsuo Taniguchi; Hidemi Kawai, both of Kawasaki, all of Japan

[73] Assignee: Nikon Corporation, Tokyo, Japan

[21] Appl. No.: 760,004

[22] Filed: Sep. 13, 1991

[30] Foreign Application Priority Data

Sep. 19, 1990 [JP] Japan .................... 2-249295
Sep. 27, 1990 [JP] Japan .................... 2-257927

[51] Int. Cl.⁵ ............................ 03B 27/42
[52] U.S. Cl. ........................ 355/53; 355/52; 355/76
[58] Field of Search ............ 355/52, 53, 75, 76

[56] References Cited

U.S. PATENT DOCUMENTS

| | | | |
|---|---|---|---|
| 3,980,405 | 9/1976 | Tatsuno et al. | 355/52 |
| 4,629,313 | 12/1986 | Tanimoto | 355/53 |
| 4,650,983 | 3/1987 | Suwa | 250/204 |
| 4,704,202 | 11/1987 | Murakami et al. | 355/53 |
| 4,734,746 | 3/1988 | Ushida et al. | 355/53 |
| 4,780,617 | 10/1988 | Umatate et al. | 250/548 |
| 4,788,577 | 11/1988 | Akiyama et al. | 355/53 |
| 4,871,237 | 10/1989 | Angai et al. | 350/419 |
| 5,008,702 | 4/1991 | Tanaka et al. | 355/53 |

*Primary Examiner*—Monroe H. Hayes
*Attorney, Agent, or Firm*—Shapiro and Shapiro

[57] ABSTRACT

An exposure apparatus for exposing on a substrate a pattern formed on a mask, comprises a projection optical system for forming the pattern on a predetermined focusing plane and projecting an image of the pattern on the substrate located to be substantially aligned with the focusing plane, driving means for three-dimensionally moving the mask or at least one of a plurality of optical system, or for inclining the mask or said at least one of the plurality of optical members with respect to a plane substantially perpendicular to an optical axis of the projection optical system and correcting means for driving the driving means to anisotropically change optical characteristics of the projection optical system so that the projected image of the pattern is matched with a pattern already formed on the substrate.

13 Claims, 7 Drawing Sheets

PROJECTION EXPOSURE APPARATUS

BACKGROUND OF THE INVENTION

1. Field of the Invention

The present invention relates to a projection exposure apparatus and, more particularly, to a projection exposure apparatus in a lithographic process of semiconductor integrated circuits.

2. Related Background Art

As a conventional projection exposure apparatus, as described in U.S. Pat. No. 4,871,237, known is a projection exposure apparatus (stepper) wherein an internal pressure between lens elements of a projection lens constituted by a plurality of lenses is changed to change the magnification of a projected image, and exposure is performed in consideration of a pattern strain caused by changes in atmosphere (e.g., an atmospheric pressure, a temperature, and a humidity) and expansion/shrinkage of wafers.

When a plurality of projection exposure apparatuses are assumed to be used, they are adjusted so that image strains between the plurality of projection exposure apparatuses are averaged and optimized so as to prevent pattern alignment errors regardless of various combinations of use of the plurality of projection exposure apparatuses.

In order to improve overlay accuracy of layers exposed by different projection exposure apparatuses, as disclosed in U.S. Pat. No. 4,734,746, there is proposed a method of adjusting relative magnifications of the respective apparatuses so as to optimize the overlay accuracy of the images projected in accordance with image strain characteristics of the respective apparatuses. According to this method, when a characteristic curve (aberration curve) associated with an image strain in a predetermined exposure range from the center (optical axis) of the field of view of the first projection exposure apparatus to a predetermined image height position is compared with that of the second projection exposure apparatus used for overlay exposure while projection magnifications of projection optical systems of these apparatuses are changed relative to each other, absolute values of differences between image strain amounts obtained at a plurality of arbitrary image height positions within the predetermined exposure range from the optical axis of the first projection exposure apparatus to a predetermined image height position and image strain amounts within the predetermined exposure range of the second projection exposure apparatus are obtained. The projection magnification of at least one of the first and second projection exposure apparatuses is adjusted so that a maximum one of the absolute values is set to be a minimum value. As a magnification correcting means, some of the distances between lens elements constituting the projection optical system are sealed from the outer air, and internal air pressures are changed. According to an alternative method, some lens elements are vertically moved in the direction of the optical axis.

Although a conventional projection exposure apparatus has a means for correcting an image strain of a projection optical system, its operation aims at mainly preventing variations in image strain in accordance with changes in atmospheric conditions or eliminating correctable residual errors during assembly adjustment.

In the conventional technique described above, however, isotropic components (i.e., components symmetric about the optical axis) of the magnification and distortion characteristics can only be controlled. For this reason, when overlay exposure is to be performed for a wafer anisotropically deformed during annealing or the like in the IC manufacture or a wafer printed in an anisotropic image strain state during exposure of the immediately preceding layer, sufficiently high overlay accuracy between a projected image and a pattern on a wafer cannot be obtained by isotropic correction as in the conventional technique. In addition, in the projection optical system arranged in the projection exposure apparatus, overlay errors inevitably occur in an image strain which cannot be eliminated by adjustment since this image strain occurs due to small machining errors during the manufacture of optical members or during assembly. In a conventional system using a plurality of apparatuses, adjustment is performed to minimize these errors in all combinations of the apparatuses. For example, assume that apparatuses A, B, and C are used. When characteristics of the apparatus A are matched with those of the apparatus B, overlay accuracy between the apparatuses A and C is degraded. It is therefore difficult to strictly match the characteristics between all the apparatuses.

Even if overlay accuracy is to be improved by adjusting magnifications of different apparatuses, only isotropic magnification correction with respect to the optical axis is available in the prior arts. When optical axes of the apparatuses are offset from each other, or an asymmetric (anisotropic) image strain with respect to the optical axis is present, the above correction does not necessarily serve as an effective means.

SUMMARY OF THE INVENTION

It is an object of the present invention to provide a projection exposure apparatus having higher overlay accuracy by controlling anisotropic distortion of a projected image.

It is another object of the present invention to provide a projection exposure apparatus having high overlay accuracy between different projection exposure apparatuses.

In order to achieve the above objects according to the first aspect of the present invention, there is provided an exposure apparatus for exposing on a substrate a pattern formed on a mask, comprising a projection optical system for forming a projected image of the pattern on a predetermined focusing plane, driving means for three-dimensionally moving the mask or at least one of a plurality of optical members constituting the projection optical system or for inclining the mask or at least one of the plurality of optical members with respect to a plane substantially perpendicular to an optical axis of the projection optical system, and correcting means for driving the driving means to anisotropically change optical characteristics of the projection optical system so as to match the projected image of the pattern with a pattern already formed on the substrate.

According to the second aspect of the present invention, there is provided an exposure apparatus for illuminating a mask having a pattern and exposing the pattern on a substrate, comprising a projection optical system for forming an image of the pattern on a predetermined focusing plane, driving means for three-dimensionally moving or inclining the mask or at least one of a plurality of optical members constituting the projection optical system to change a shape of the projected image of a circuit pattern, processing means for receiving first characteristic information associated with an anisotropic image strain of a projection optical system of an exposure apparatus which exposed a first pattern already formed on the substrate and second characteristic information associated with an anisotropic image strain of a projection optical system of an exposure apparatus to be used in the next step of mapping a second pattern and exposing the second pattern on the substrate, and for calculating a movement amount of the driving means so that a difference between the image strains based on the first characteristic information and the image strain based on the second characteristic information is set relatively minimum, and position control means for driving the driving means on the basis of the movement amount input from the processing means.

According to the first aspect of the present invention, since the image strain shape can be changed to an almost arbitrary shape, even if the pattern on the substrate is anisotropically deformed by an influence of a process, the projected image of the pattern formed on the mask can be mapped with high precision. Since the image strain shape can be changed to an almost arbitrary shape, even if optical axes of a plurality of exposure apparatuses used for different layers are not aligned with each other or an asymmetrical image strain is present with respect to the optical axis, the image is asymmetrically strained with respect to the optical axis, so that higher overlay accuracy can be expected. A semiconductor element finished by repeating a plurality of steps can be formed with high overlay accuracy.

According to the second aspect of the present invention, the image strain amount for optimal overlay accuracy between the circuit patterns of the mask and the substrate is calculated on the basis of the characteristics associated with the image strain of the projection optical system of the exposure apparatus used in the previous or succeeding step and the characteristics associated with the image strain occurring upon driving of the driving means. The image strain is corrected by this image strain amount. For this reason, as compared with the method wherein an image strain is adjusted so that an optimal average value is obtained in all combinations of the plurality of apparatuses, the image strain amounts of different types of exposure apparatuses used for different layers, i.e., the characteristics associated with the asymmetric image strain can be more strictly matched.

When layers are to be mapped with extremely high precision, specific apparatuses need not be selected as a best combination from a large number of projection exposure apparatuses. Limitations of use of apparatuses on a semiconductor element fabrication line can be reduced. According to the present invention, as has been described above, when the different layers on the wafer are subjected to overlay exposure using different projection exposure apparatuses, overlay accuracy of the circuit patterns can be improved.

Even if exposure apparatuses having different exposure schemes such as a mirror projection scheme, a proximity scheme, and a contact scheme are installed along the fabrication line constituted by a plurality of projection exposure apparatuses, the projection exposure apparatus according to the present invention is used to perform high-accuracy overlay exposure.

DESCRIPTION OF THE PREFERRED EMBODIMENTS

Figure 1:
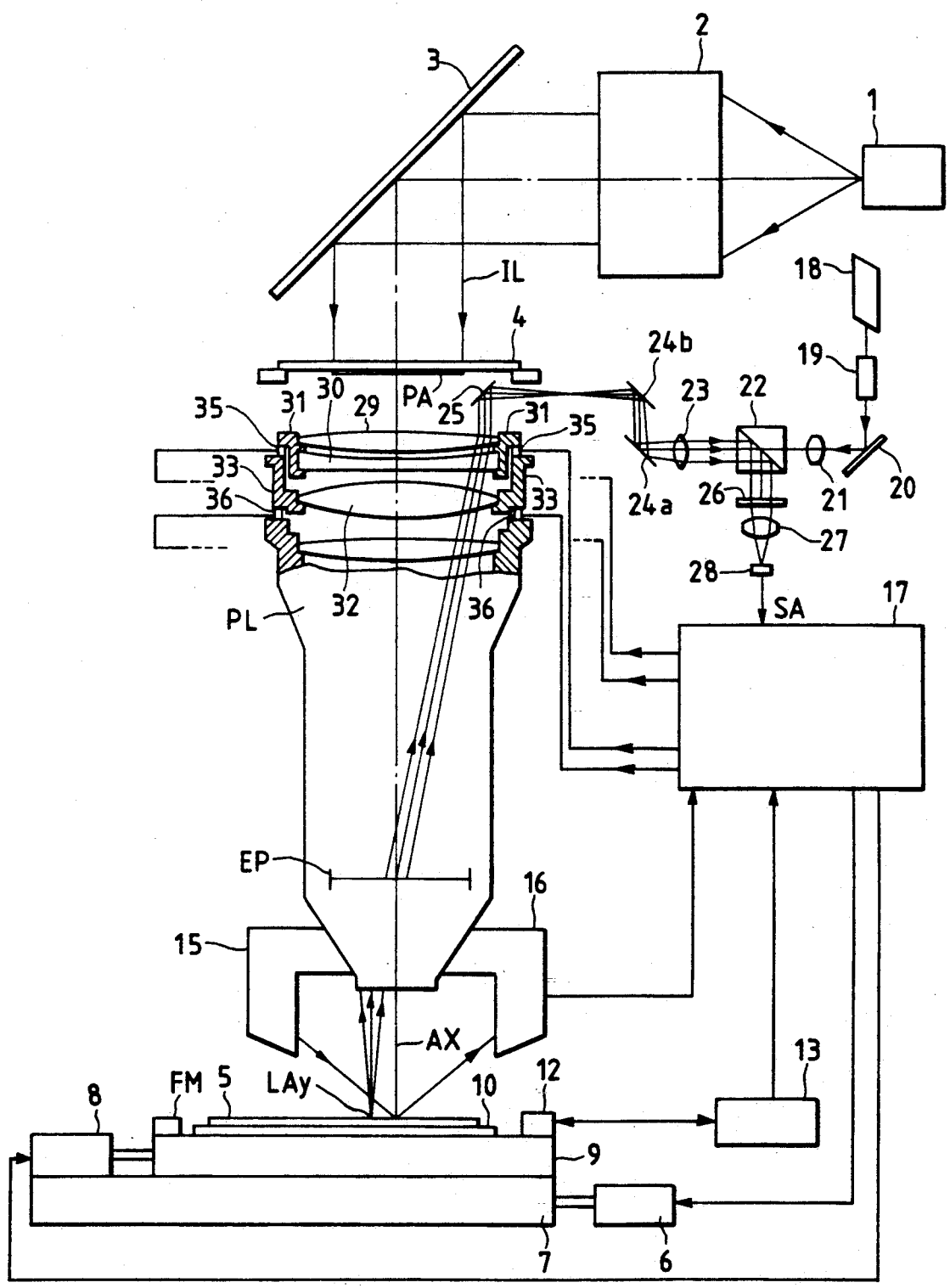
FIG. 1 is a plan view showing an overall arrangement according to the first embodiment of the present invention.

Preferred embodiments of the present invention will be described with reference to the accompanying drawings. FIG. 1 is a plan view showing an arrangement suitable for the first embodiment of the present invention.

A beam emitted from an illumination light source 1 such as a very high-pressure mercury lamp or an excimer laser is incident on an illumination optical system 2 including fly array lens and a condenser lens. The beam uniformed by the illumination optical system 2 is reflected vertically downward by a reflecting mirror 3 arranged above a reticle 4 and inclined at 45° with respect to an optical axis AX of the projection lens PL. The reticle 4 is illuminated at a uniform illuminance. A beam passing through a pattern area PA of the reticle 4 is incident on the projection lens PL. The projection lens PL projects an image of a circuit pattern formed in the pattern area PA onto a wafer 5 held so that a wafer 5 is almost aligned with a focusing plane of the projection lens PL. The incident and emerging sides of the projection lens PL are constituted by telocentric optical systems (i.e., so-called two-sided telocentric systems).

A two-dimensional stage (to be referred to as a wafer stage hereinafter) is constituted by an X-Y stage 7 movable by the drive unit 6 in the X and Y directions, a Z stage 9 vertically movable in the Z direction (i.e., the direction of the optical axis AX of the projection lens PL) with respect to the X-Y stage 7, and a wafer holder 10, arranged on the Z stage 9, for vacuum-chucking the wafer 5. A laser interferometer 13 projects a laser beam on a reflecting mirror 12 to detect the position of the wafer stage. A light-emitting element 15 and a light-receiving element 16 constitute a gap sensor for detecting a gap between the focusing plane of the projection lens PL and the surface of the wafer 5. The arrangement and the like of this sensor are disclosed in, e.g., U.S. Pat. No. 4,650,983. The light-emitting element 15 projects a pinhole or slit image on the focusing plane of the projection lens PL obliquely with respect to the optical axis AX. The light-receiving element 16 receives light obtained by reflecting the slit light image on the wafer 5 and detects the position of the wafer 5 in the Z direction, i.e., the gap between the projection lens PL and the wafer 5. In addition, the light-receiving element 16 detects a change in light-receiving position of the light reflected by the wafer 5 and outputs a focus signal representing the surface position of the wafer 5. This output signal is input to a main control system 17. The main control system 17 outputs a control signal for servo-controlling the drive unit 8 for vertically moving the Z stage 9 on the basis of this focus signal. The position of the Z stage 9 is adjusted to accurately match the surface of the wafer 5 with the focusing plane.

A light-emitting pattern FM (Fiducial Mark) is formed on almost the same surface as the wafer surface. This pattern FM consists of a pair of light-transmitting slit patterns respectively extending in the X and Y directions. The pattern FM is illustrated from the below (inside the stage) with illumination light (exposure light) guided below the pattern FM through an optical fiber (not shown). The illumination light passing through the pattern FM is transmitted through the projection lens PL, and a projected image of the pattern FM is formed on the lower surface (pattern surface) of the reticle 4. Although not illustrated, a photoelectric sensor for receiving the illumination light passing through the slit-like alignment mark formed on the reticle 4 is arranged on a plane conjugate with a pupil plane of the projection lens PL in the illumination optical system 7. The stage 7 is moved to scan the image of the pattern FM on the alignment mark. When the pattern image overlaps the alignment mark, the photoelectric sensor has a maximum (or minimum) light amount. When the stage position corresponding to the maximum (or minimum) light amount is measured, the relative positional relationship between the reticle 4 and the stage 7 is detected.

The positioning optical system (alignment optical system) for the wafer 5 will be described below. A laser beam from a laser source 18 is spread to have a predetermined beam diameter by a beam shaping system 19 constituted by a beam spreader and a cylindrical lens, so that the laser beam is formed as a beam spot having an elliptical section. The shaped laser beam is reflected by a mirror 20 and is incident on the projection lens PL by mirrors 24a, 24b, and 25 through a lens 21, a beam splitter 22, and a lens 23. The laser beam passing through the projection lens PL is focused on the wafer 5 as a light spot LAy having a shape extending in the X direction by means of the cylindrical lens. Since a positioning diffraction grating pattern Py (alignment pattern) is formed on the wafer 5, diffracted light emerges from the alignment pattern upon scanning of the alignment patten with the beam spot LAy. These pieces of optical information from the alignment patterns are reversely incident on the projection lens PL and are reflected by the mirrors 24a, 24b, and 25 through an incident pupil EP. The reflected beam is then reflected by the beam splitter 22 through the lens 23 and reaches a spatial filter 26. The spatial filter 26 is located at a position conjugate with the incident pupil EP of the projection lens PL and shields only the 0th-order diffracted beam from the wafer 5. The spatial filter 26 transmits only diffracted components of higher orders. The focusing lens 27 focuses these diffracted components on a light-receiving element 28. The light-receiving element 28 outputs a photoelectric signal SA corresponding to the intensity of diffracted light. This photoelectric signal SA is input to the main control system 17. The main control system 17 also receives position information (e.g., a time-serial up/down pulse signal) from the interferometer 13 and detects a generation position (scanning position) of the photoelectric signal SA corresponding to the diffracted light from each alignment pattern. More specifically, the photoelectric signal SA is sampled in synchronism with the up/down pulse signal generated every time the stage 7 is moved by a unit movement amount (0.01 $\mu$m). Sampling values are converted into digital values, and the digital values are stored in a memory in an order of smaller addresses. A predetermined arithmetic operation is performed to calculate coordinates of each alignment pattern. The main control system 17 controls the drive unit 6 on the basis of the position information of the alignment pattern. The wafer stage is positioned so that the center of the projected image of the reticle pattern is aligned with the center of the circuit pattern (chip) on the wafer 5. When the optical axis AX of the projection lens PL is defined to pass through the origin of the x-y or orthogonal coordinate system, the beam spot LAy is elongated along the x-axis, i.e., in the x direction and is used to detect the y position of the alignment pattern extending on the wafer 5 along the x direction. Although FIG. 1 shows only one alignment optical system, another alignment optical system having the same arrangement as that of FIG. 1 is arranged in a direction perpendicular to the drawing surface of FIG. 1 in practice. A beam spot LAx of this alignment optical system is elongated along the y-axis, i.e., the y direction and is used to detect the x position of the alignment pattern Px extending on the wafer 5 in the y direction. Note that position information of a shape strain measurement pattern (to be described in detail below) is measured by using this alignment optical system in this embodiment.

Figure 2:
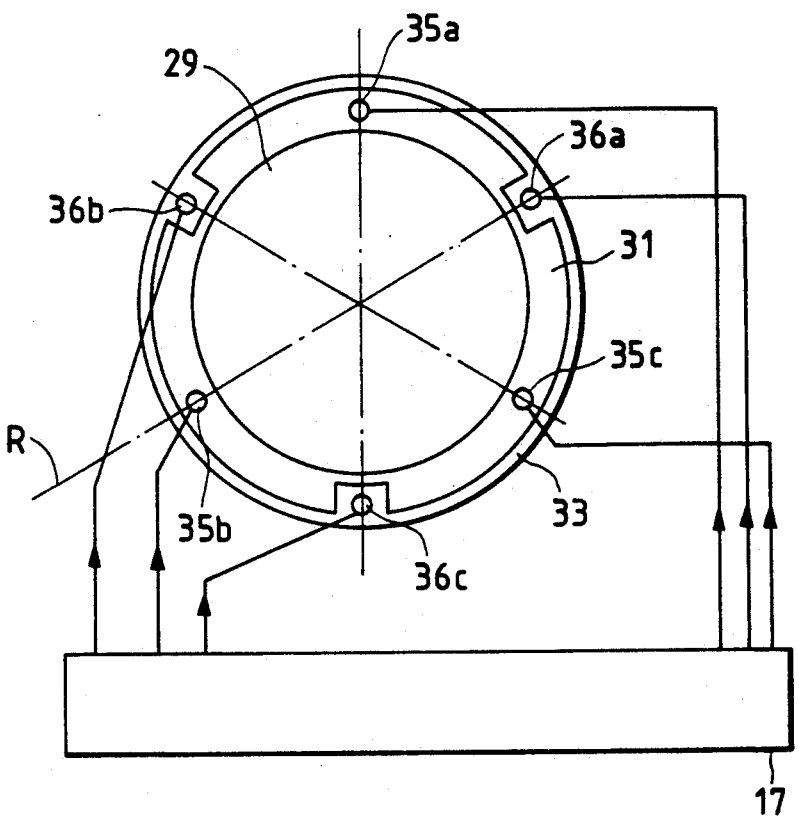
FIG. 2 is a plan view of a projection lens PL viewed from the top.

The structure of the projection lens PL, some constituting elements of which are movable to cope with a wafer shape strain, will be described below. As shown in FIG. 1, first group lens elements 29 and 30 located nearest to the reticle 4 are fixed by a lens support member 31, and a second group lens element 32 is fixed by a lens support member 33. Lens elements below the lens element 34 are fixed in the lens barrel of the projection lens PL (the optical axis AX of the projection lens PL is defined as an optical axis of the lens elements fixed in the lens barrel). The lens support member 33 is connected to the lens barrel of the projection lens PL by extendible drive elements 36a, 36b, and 36c (FIG. 2). The lens support member 31 is connected to the lens support member 33 by extendible drive elements 35a, 35b, and 35c (FIG. 2). The lens elements 29, 30, and 32 near the reticle 4 are movable and are selected from the lens elements which facilitate control of influences on the magnification and distortion characteristics as compared with other lens elements.

Note that the lenses are moved within the negligible range of other aberrations (e.g., astigmatism) of the projection lens PL. Alternatively, by adjusting the distances between the lens elements to control the magnification and distortion characteristics, other aberrations may be corrected. In order to satisfactorily cope with a shape strain, ① the movement range of the lens elements must be increased while other aberrations are kept minimized, and ② various types of shape strains (e.g., trapezoidal, rhombic, barrel, and hourglass shapes) must be satisfied. For this purpose, the movable lens groups are not limited to two lens groups. Three or more lens groups (e.g., four groups, five groups, ...) satisfying conditions ① and ② may be used to constitute the projection lens PL.

FIG. 2 is a view of the projection lens PL viewed from the top. The drive elements 35a, 35b, and 35c are located at equal angular intervals of 120° and can be independently controlled by the main control system 17. Similarly, the drive elements 36a, 36b, and 36c are located at equal angular intervals of 120°, so that the drive elements 35a and 36a are angularly spaced apart from each other by 60°. The drive elements 35b and 36b and the drive elements 35c and 36c are also angularly spaced apart by 60° each. The drive elements 35 and 36 comprise electrostrictive elements or magnetostrictive elements. A displacement of each drive element according to a voltage or magnetic field applied to the drive element is predetermined. In consideration of hysteresis of the drive element, if a capacitive position sensor or a differential transformer as a position sensor is located near the drive element, the position of the drive element which corresponds to the voltage or magnetic field applied to the drive element can be monitored, thereby performing high-precision driving.

Three points around the two group lens elements, i.e., the first group lens elements 29 and 30 and the second group lens element 32, can be moved in accordance with drive amounts of the drive elements in the axial direction (AX) of the projection lens PL. As a result, the lens element groups (29 and 30) and (32) can be independently inclined with respect to the plane perpendicular to the optical axis AX. Note that the lenses are inclined about a virtual optical axis (i.e., an optical axis defined without any inclination) of the lens elements (29, 30, and 32).

Figure 3A:
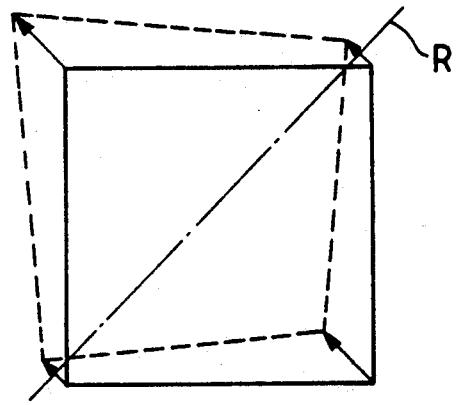
FIGS. 3A and 3B are views showing characteristics of drivable lens elements.
Figure 3B:
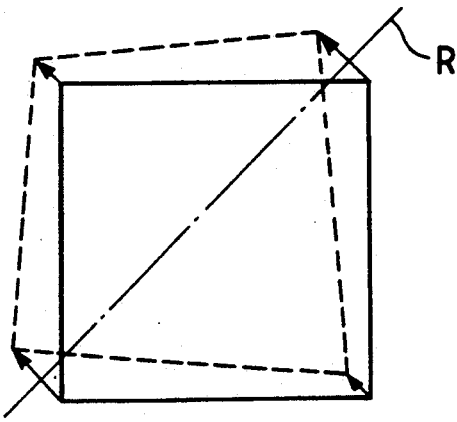

By driving these two lens groups, the distortion characteristics of the projection lens are changed. For example, the first lens group has characteristics for largely deforming an image portion located away from a rotational axis R in a direction perpendicular to the rotational axis R, as shown in FIG. 3A when the lenses are inclined with respect to a perpendicular bisector of the drive elements 35a and 35c as the virtual rotational axis R. The second lens group has characteristics for largely deforming an image portion located near the rotational axis R in the direction perpendicular to the rotational axis R, as shown in FIG. 3B, when the lenses are inclined with respect to the same virtual rotational axis R. Since a large number of virtual rotational axes can be equivalently given to these lens groups, various directions are provided for an image strain. For this reason, when specific directions of image deformation amounts determined by these lens groups are added to each other as a vector sum, the distortion characteristics of the respective lens groups can be determined. When the distortion characteristics of the first and second groups are combined (i.e., the vector sum), a projected image can be matched with an anisotropic shape strain of the wafer such as a trapezoidal strain and a rhombic strain. In addition, when the lens elements (29, 30, and 32) are two-dimensionally moved in the x-y plane perpendicular to the optical axis AX, the distortion characteristics of the projection lens can be anisotropically changed. In this case, the drive elements are located to be displaced within the x-y plane, and the lens elements are located to be movable within the x-y plane. For example, two drive elements displaceable in the x direction are located at positions opposite along the x-axis, and two drive elements displaceable in the y direction are located at opposite positions along the y-axis.

Figure 4:
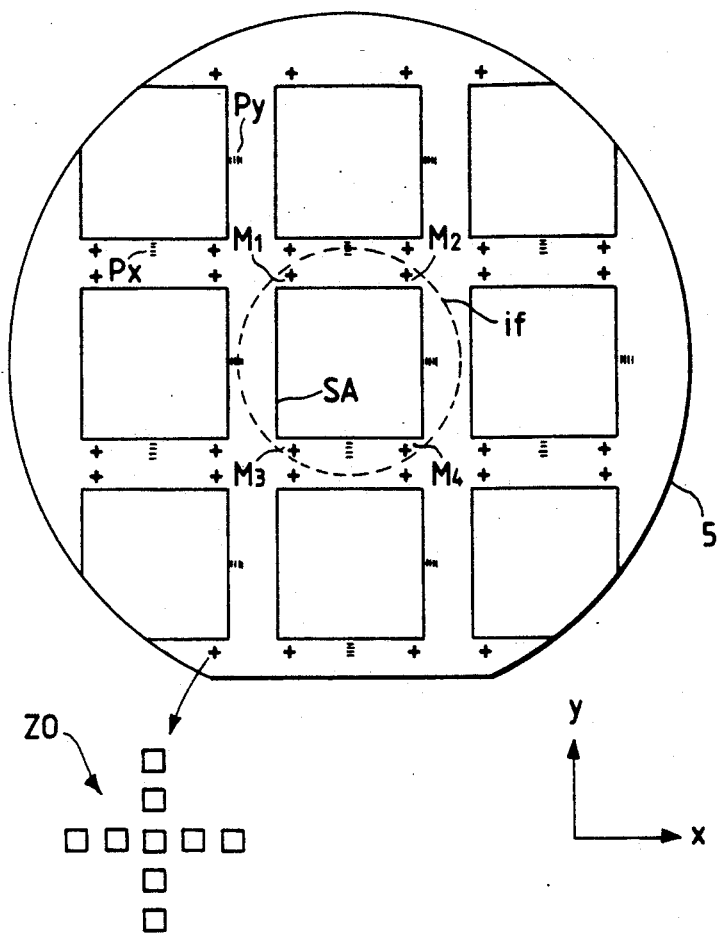
FIG. 4 is a view showing a pattern formed on a wafer.

In addition to the alignment patterns Px and Py formed on the wafer 5, shape strain measurement patterns M1 to M4 are patterned in a peripheral portion of each shot area SA, as shown in FIG. 4. The patterns M1 to M4 are located inside an exposure field "if" when the center of the exposure field "if" is aligned with the center of the shot area SA.

Each of the shape strain measurement patterns M1 to M4 is illustrated in an enlarged view ZO. The positions of the shape strain measurement patterns M1 to M4 are detected by using the alignment optical systems described above. Deformation amounts of the shape strain measurement patterns formed on the wafer 5 in correspondence with projected images of the shape strain measurement patterns of the reticle projected in accordance with the predetermined optical characteristics (e.g., distortion characteristics) of the projection lens PL are calculated by the main control system 17. A relationship between the drive amounts of the drive elements 35 and 36 predetermined by optical calculations or actual measurements and the distortion characteristics of the projection lens PL is prestored in the main control system 17 in the form of a table (or mathematical expressions). The drive amounts of the drive elements 35 and 36 are determined on the basis of the values of this table and the deformation amounts obtained by the alignment optical systems, and drive control signals are supplied to the drive elements 35 and 36. Overlay exposure can be performed to cope with the anisotropically deformed wafer 5. At least four patterns formed outside each shot area on the wafer are preferably used as the shape strain measurement patterns.

The shape strain measurement patterns may also serve as alignment patterns.

Deformation amount correction of this embodiment will be described below.

[Step 1]

Positions of the shape strain measurement patterns formed on the wafer are measured first. These measurements are performed by using alignment sensors.

The wafer stage is positioned using the main control system 17 and the interferometer 13 to relatively scan a shape strain measurement diffraction grating pattern such as M1 extending in the y direction with the light spot LAx. Diffracted light is generated at a position where the light spot LAx is aligned with this shape strain measurement pattern. This diffracted light is incident on the projection lens PL and is focused on the light-receiving element 28. The light-receiving element 28 outputs a photoelectric signal SA corresponding to the intensity of the diffracted light. This photoelectric signal SA is input to the main control system 17. The photoelectric signal SA has a time-serial waveform. The main control system 17 samples the photoelectric signal SA in accordance with up/down pulses, and the sampled waveform is stored in the memory. The memory address at which the photoelectric signal SA is stored in response to the up/down pulse has correlation with the stage position. For example, the main control system 17 detects a peak position of the wave as a position coordinate P1x of the shape strain measurement pattern M1. Similarly, the light spot LAy and the shape strain measurement pattern M1 are relatively scanned in the y direction, and the position coordinate of the shape strain measurement pattern is detected as P1y. In addition to the shape strain measurement pattern M1, other shape strain measurement patterns M2 to M4 are formed around the shot area SA of the wafer 5, as shown in FIG. 4. Position coordinates of the plurality of shape strain measurement patterns are similarly obtained.

[Step 2]

A method of calculating a correction amount for correcting optical characteristics of the projection lens PL so as to correspond to the deformation of the wafer 5 will be described below.

The distortion characteristics (predetermined optical characteristics inherent to the projection lens PL) are obtained in advance by preliminary printing using a test reticle and are obtained as a distortion amount D1 by the projection lens PL.

Differences between position coordinates (shape strain measurement pattern positions measured after the actual exposure, annealing, and the like are performed) P1x to P4x and P1y to P4y of the shape strain measurement patterns M1 to M4 and design value coordinates of the shape strain measurement patterns are calculated to obtain anisotropic deformation amounts (e.g., an anisotropic deformation amount such as a trapezoidal deformation amount) D2 of the wafer 5 with respect to the design values. Differences D3 between the distortion amounts D1 and the deformation amounts D2 are determined as deformation amounts of the shape strain measurement patterns formed on the wafer 5 with respect to the projected images of the shape strain measurement patterns formed on the reticle 4. These values serve as correction values.

The calculations of these correction values D3 are mainly performed in the main control system 17, and the correction values are stored in the memory.

[Step 3]

A method of changing the optical characteristics of the projection lens PL to nullify the deformation amount of the wafer 5 to almost zero will be described below.

The drive elements 35 and 36 are driven to incline the lens elements 29, 30 and 32 with respect to a plane perpendicular to the optical axis of the projection lens PL. The optical characteristics of the projection lens PL are anisotropically changed to forcibly apply a distortion amount to the pattern-projected image so as to nullify the deformation amount to almost zero, thereby correcting the deformation amount. The drive amounts (lens element movement amounts) of the drive elements 35 and 36 are determined on the basis of the correction amounts D3 obtained in step 2. The relationship between the drive mounts of the drive elements 35 and 36 and the distortion amounts (shape strain amounts of the forcibly deformed pattern projected images) of the projected images by means of these drive amounts is obtained by optical calculations or preliminary printing in the form of a table or mathematical expressions and is stored in the main control system 17. The main control system 17 calculates drive amounts of the drive elements 35 and 36 from the correction amounts D3 and values of the table (or mathematical expressions), both of which are prestored in the memory. This calculation is performed to determine a drive amount so that a maximum value of an absolute value of a correction amount of each of the plurality of patterns becomes minimum or that a square sum of correction amounts of each pattern becomes minimum.

[Step 4]

On the basis of the above drive amounts, the main control system 17 supplies drive control signals to the drive elements 35 (35a, 35b, and 35c) and 36 (36a, 36b, and 36c) to incline the lens elements 29, 30, and 32, thereby anisotropically changing the optical characteristics of the projection lens PL. For this reason, the anisotropic deformation of the wafer can be corrected. Linear deformation can be corrected by axially moving the lens elements 29, 30, and 32, as a matter of course.

Figure 5:
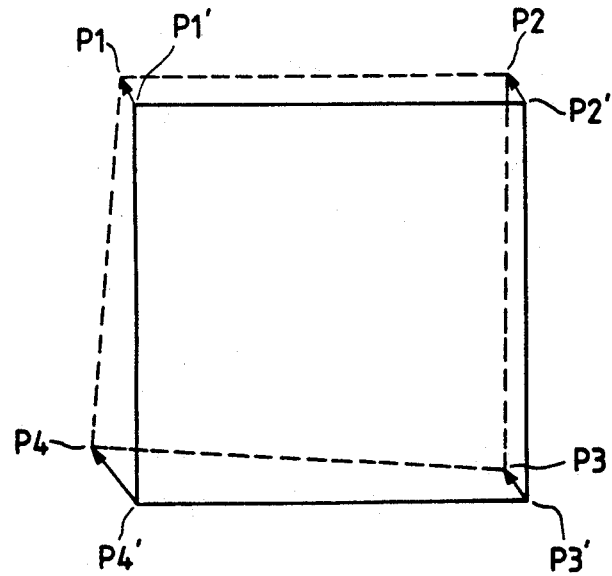
FIG. 5 is a view showing deformation amount correction according to the first embodiment of the present invention.

FIG. 5 shows an operation of the above deformation amount correction. When the positions of the shape strain measurement patterns formed on the wafer 5 are strained to form a rhombic shape, the lens elements 29, and 32 are moved by the drive elements 35 and 36 so that points P1' to P4' are shifted to points P1 to P4 to nullify the deformation amounts of the patterns on the wafer.

This embodiment can cope with this anisotropic deformation.

Similar correction can be performed when the lens elements 29, 30, and 32 are two-dimensionally moved in a plane perpendicular to the optical axis of the projection lens PL to correct an anisotropic deformation amount.

A method of inclining the reticle 4 with respect to a plane perpendicular to the optical axis of the projection lens PL may be used. It is, however, not sufficient to incline the reticle when a projection lens has telocentric lenses on the incident and emerging sides. Therefore, the lenses are driven (i.e., the optical characteristics of the projection lens PL can be anisotropically changed by lens driving easier than reticle inclination).

Some of the lens elements are driven to cope with the curvature of field and warp of the wafer 5. In order to cope with the warp or the like, the gap sensor (15 and 16) is used to measure deformation amounts. More specifically, displacement amounts of the wafer points on the focusing plane of the projection lens PL are measured by the gap sensor (15 and 16) and are defined as deformation amounts. When the relationship between the drive amounts of the drive elements 35 and 36 and these deformation amounts is obtained in advance, correction can be performed in the same manner as described above. When variations in focal point occur upon movement of the lens elements in a plane perpendicular to or inclined from the optical axis, variation amounts may be added as offset amounts to the measurement values from the gap sensor (15 and 16).

As described above, predetermined optical characteristics of the projection lens PL are obtained by preliminary printing. However, the predetermined optical characteristics may be obtained by measuring distortion measurement marks formed on an intermediate one of the reticles 4 and by comparing the measurement values with the design values. In addition, when a two-pattern reticle is used, shape strain measurement patterns may be formed between the pattern areas. The deformation amounts of the wafer 5 can be more accurately measured by using these wafer measurement points.

[First Modification]

In the above embodiment, the optical characteristics (distortion amounts D1) of the projection lens PL are obtained as needed; the deformation amounts D2 representing the differences between the position coordinates of the shape strain measurement patterns M1 to M4 formed on the wafer 5 and obtained by using the interferometer 13 and the position coordinates (design values) of the images of the shape strain measurement patterns (on the reticle 4) projected on the wafer 5 are obtained; and the correction amounts D3 are obtained as differences between the distortion amounts D1 and the deformation amounts D2.

In this modification, however, a deformation amount can be obtained in accordance with a through-the-reticle (TTR) scheme using a TV camera for directly measuring through the reticle 4 and the projection lens PL each shape strain measurement pattern formed on the wafer 5 and the corresponding shape strain measurement pattern formed on the reticle. According to this scheme, since the patterns formed on the reticle 4 and the wafer 5 can be simultaneously observed through the projection lens PL, the distortion characteristics of the projection optical system need not be calculated in advance, unlike in the case wherein coordinate values on the wafer coordinate system are compared using an interferometer. When the absolute value of the difference between the corresponding shape strain measurement patterns formed on the reticle 4 and the wafer 5 is measured, the absolute value of the deformation amount of the shape strain measurement pattern formed on the wafer with respect to the image obtained by projecting the corresponding shape strain measurement pattern of the reticle 4 in accordance with the predetermined optical characteristics is directly obtained. Therefore, the differences between the patterns on the reticle and the wafer can be applied to drive amount calculations as correction amounts. Alternatively, the drive elements are finely driven by actual difference measurements so that the patterns on the reticle 4 are optimally mapped on the patterns on the wafer 5, thereby obtaining desired strain characteristics.

[Second Modification]

Figure 6:
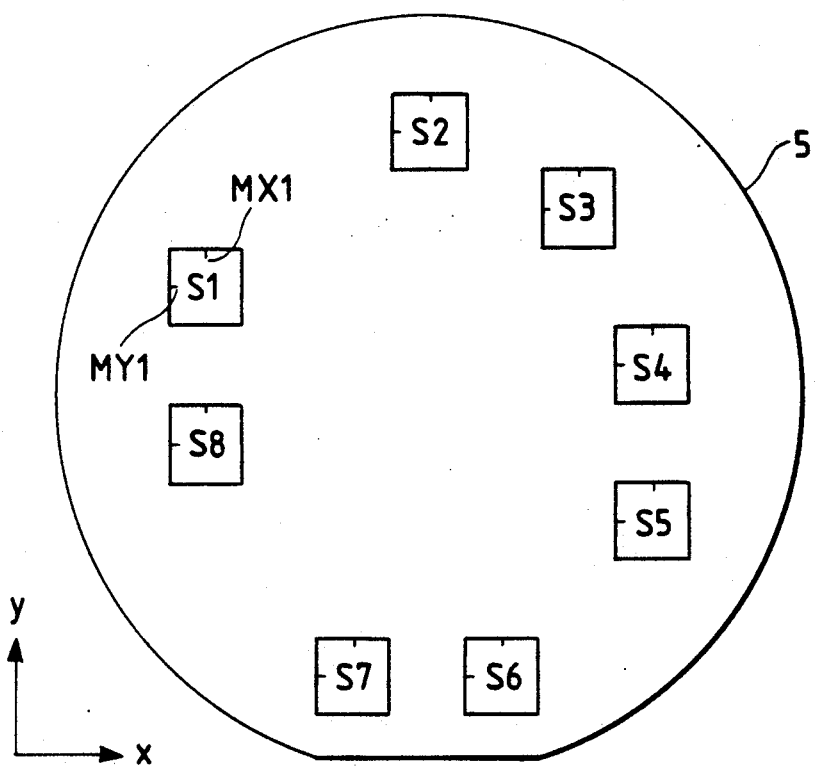
FIG. 6 is a view showing a shot area for measuring an EGA value.

The second modification will be described below. In the above embodiment, since measurements and correction of the deformation amounts are performed every shot on the wafer 5 during exposure, the throughput is undesirably decreased. A method of measuring deformation amounts of the wafer 5 in the same method as the method of selecting some shots on the wafer 5 and obtaining a shot position on the wafer on the basis of statistical processing may be used and will be briefly described below. The principle of this method is originally used in measurement (so-called alignment) of a shot position in overlap exposure of wafer patterns. This method aims at shortening the measurement time and improving the measurement precision by averaging measurement errors by statistical processing. This method is called an enhanced global alignment (EGA) scheme, as disclosed in detail in U.S. Pat. No. 4,780,617. This principle will be briefly described with reference to FIG. 6. According to the EGA scheme, positions of marks MYn and MXn of a plurality (3 to 9) of shot areas Sn (S1 to S8 in this case) on the wafer 5 are measured (sampled and aligned). Thereafter, statistical arithmetic operations are performed on the basis of the measurement values using as parameters a small rotational error in the x-y coordinate system (defined by the interferometer), i.e., a traveling coordinate system of the stages (7 and 9) for the wafer 5, orthogonality w of the shot array (or stage traveling) on the wafer 5, scaling errors Rx and Ry caused by small linear expansion/contraction of the wafer 5, and small positional errors, i.e., offset errors Ox and Oy, of the wafer 5 in the x and y directions. The designed shot array coordinates are converted into shot array coordinates (i.e., stepping position coordinates on the wafer stage) to be actually exposed. The wafer stage is then moved by only the calculated array coordinates, the image of the pattern region PA of the reticle 4 is sequentially moved and aligned with each shot area Sn of the wafer 5, thus sequentially performing overlay exposure. The deformation amounts of the wafer are measured by using this EGA method.

Figure 7:
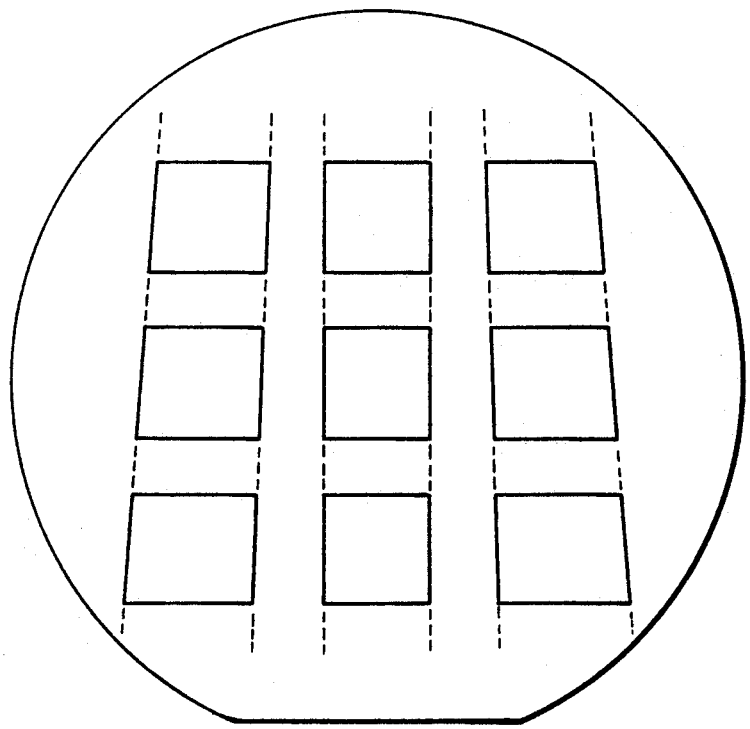
FIG. 7 is a view showing a wafer anisotropically strained as a whole.

More specifically, when shot array coordinates are anisotropically changed with a certain tendency of the wafer as a whole, anisotropic factors are added in addition to the above parameters to perform an statistical operation to obtain deformation amounts. For example, when deformation amounts of the wafer 5 having array coordinates constituting a trapezoidal shape, as shown in FIG. 7, are to be obtained, nonparallel factors (anisotropic factors) of the shot coordinates are added as a parameter to perform a statistical arithmetic operation. The lenses are driven on the basis of the resultant deformation amounts. As compared with the measurement in units of shots as in the above embodiment, ① the measurement span is long, and high-precision measurement can be performed, ② an averaging effect can be obtained, and ③ the throughput is increased.

When the wafer is not deformed as a whole but locally deformed, the surface of the wafer 5 is divided into several areas (blocks), and deformation amounts of the wafer 5 in units of blocks are obtained.

When the drive amounts of the drive elements are determined on the basis of the deformation amounts measured in units of blocks, and the lenses are driven to map the projected images on the patterns on the wafer, the EGA scheme can cope with the shape strain of the locally deformed wafer at a high throughput while averaging factors are left unchanged. When this EGA scheme is used in strain measurement, a shift amount of the center of the image, which is caused by driving of the lenses, can be obtained in accordance with the drive amounts, and the shift amount is added to the EGA error parameters as offset values, thereby performing overlay exposure with higher precision.

Deformation amounts of several shots upon their measurements in units of shots as in the above embodiment are compared with the deformation amounts obtained in the calculations of the EGA scheme to confirm the calculation results. If any error occurs in this comparison, and parameters (anisotropic factors) are corrected in accordance with an error amount, more accurate deformation amounts can be obtained.

The expansion/contraction coefficient of each wafer is solely determined by a temperature, a material, and the like. For example, if a given wafer has a known expansion/contraction coefficient, and the wafer expands/contracts radially with respect to the center of the wafer, the expansion/contraction amount is solely determined in accordance with a distance from the center of the wafer. For this reason, a method of obtaining a deformation amount of each shot from the distance (design value) from the center of the wafer 5 may be used. An expansion/contraction coefficient (or a relationship between the expansion/contraction and the distance from the center of the wafer) is preferably obtained for each of the types and thicknesses of wafers, resist materials, and underlying materials, and process conditions (e.g., annealing conditions), and the obtained coefficient is preferably stored in a memory in the form of a mathematical expression or a table.

When an EGA alignment scheme is used, a distance from the center of the wafer may be measured by using the central position of each shot obtained by the EGA calculation, and then a deformation amount may be obtained. At this time, a measurement mark position is obtained from the center of each shot and the predetermined expansion/contraction coefficient. This mark position is compared with a mark position used in the EGA measurement. If a difference between these two mark positions is present, the expansion/contraction coefficient is corrected to improve measurement accuracy. Note that this correction is also applicable to correction amount calculation using the central design value and the expansion/contraction coefficient in accordance with the EGA alignment scheme.

When deformation amount calculations using an expansion/contraction coefficient are performed in units of blocks, this scheme can cope with a case wherein expansion/contraction in the radial direction locally varies. In addition, the area of the wafer 5 is divided into several blocks, and deformation amounts of several shots in each block are calculated in accordance with the method of the above embodiment. A deformation amount for minimizing the deformation amount of each shot is calculated, and the lenses can be driven in units of blocks in accordance with this deformation amount.

In the above embodiment, the deformation amounts are measured to perform overlay exposure in units of wafers. However, the drive elements may be controlled to perform exposure corresponding to deformation by using the deformation amounts obtained prior to exposure without measuring the deformation amounts in each exposure operation.

In strain measurement according to the EGA scheme, the deformation amounts of the first wafer of a lot or each block of the first wafer are measured during wafer global alignment. Since a similar tendency is found in expansion/contraction deformation in units of lots in EGA strain measurement, only the first wafers of the respective lots can be subjected to the EGA strain measurement. Measurements of deformation amounts are not performed at the time of exposure, and the measurement values of the first wafer are used to drive the lenses and perform overlay exposure. According to this method, exposure can be performed at a high throughput with high overlay accuracy without performing measurement of the shape strain amounts during the exposure. Note that the method using only the measurement values of the first wafer of each lot is not limited to the strain measurement, but can also be applied to measurement in units of shots as in the above embodiment.

[Third Modification]

The third modification will be described below.

The above embodiment exemplifies the method of mapping the projected images on the patterns on the wafer 5 anisotropically deformed in the process. In this modification, a test reticle is used to obtain a deformation amount caused by the process. On the basis of this deformation amount, the image is distorted from the beginning at the time of actual exposure of the wafer 5 so that almost a desired pattern is obtained by deformation during the process. In this manner, the projected image is forcibly distorted and exposed. The pattern having a shape strain is formed as an almost ideal pattern by utilizing process deformation. When this method is practiced, and the same operations as in the above embodiment are performed, the drive amounts of the lenses during deformation correction of the wafer 5 can be reduced, and the throughput can be increased. At this time, when this correction amount is added to the forcible distortion amount applied during pattern projection, a more ideal pattern can be formed. If a block having a shape strain is selected to perform EGA measurement, the throughput can be further increased.

[Fourth Modification]

The fourth modification will be described below.

As a method of changing a magnification and isotropic distortion of an optical system, a method of changing a pressure between lens elements is known as disclosed in U.S. Pat. No. 4,734,746. When this method is combined with the method of driving the lens elements described in the above embodiment to change the pressure to cope with the variations in magnification and isotropic deformation of the wafer and to drive the lens elements to cope with anisotropic deformation of the wafer 5.

It is also possible to change isotropic distortion by vertically moving the reticle 4 along the optical axis AX of the projection lens PL.

The variations in magnification are caused to correspond to changes in pressure, isotropic deformation of the wafer 5 is coped with vertical movement of the reticle 4, and the anisotropic deformation of the wafer is coped with driving of the lens elements.

[Second Embodiment]

Figure 8:
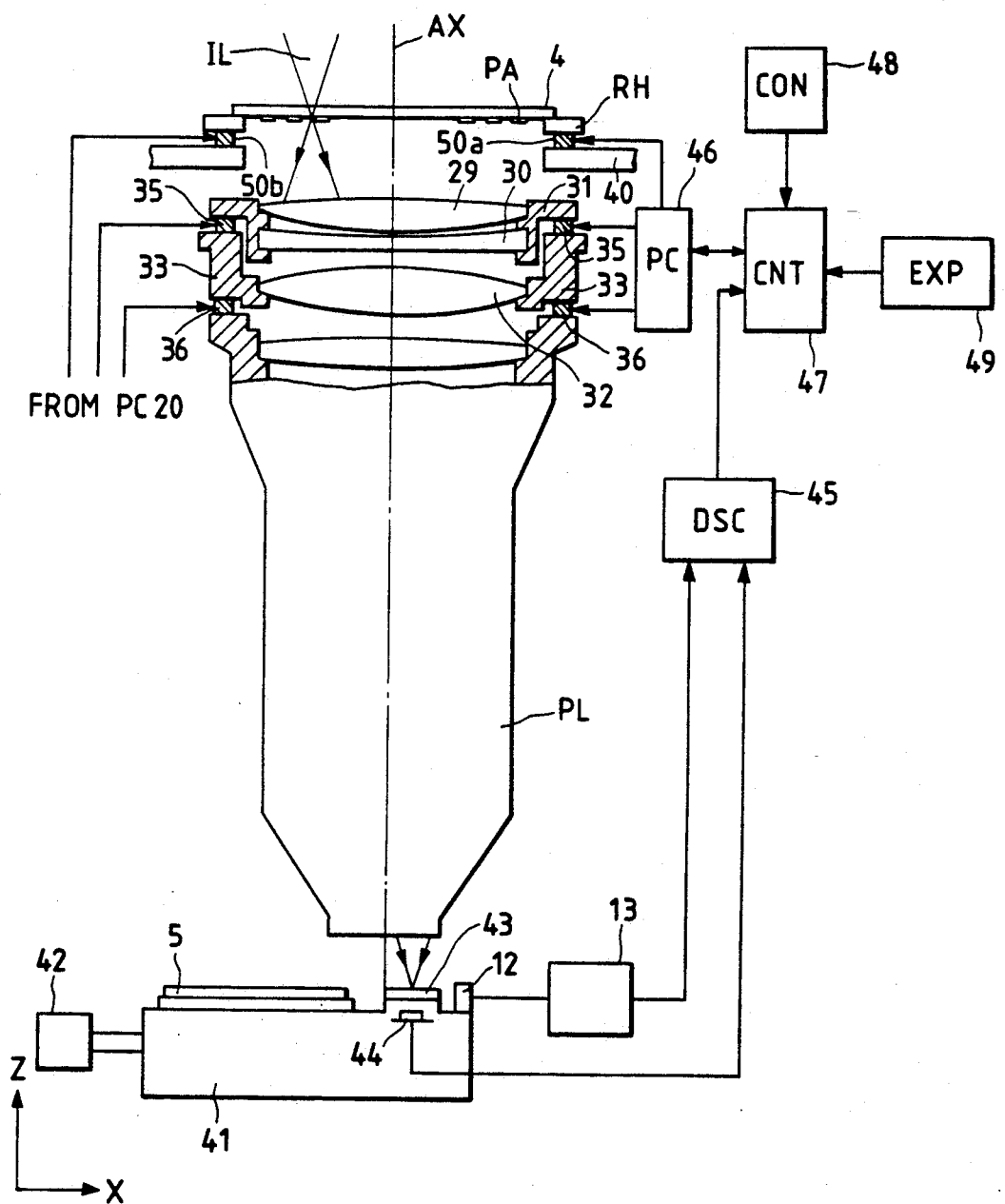
FIG. 8 is a view showing a schematic arrangement of a projection exposure apparatus according to the second embodiment of the present invention.

The second embodiment will be described below. FIG. 8 is a schematic view showing part of a projection exposure apparatus suitable for the second embodiment. The same reference numerals as in FIG. 1 denote the same parts in FIG. 8.

The second embodiment of the present invention will be described in detail with reference to the accompanying drawings.

A reticle 4 is placed on a reticle stage 40 through a reticle holder RH and piezoelectric elements $50a$ to $50d$ (only the piezoelectric elements $50a$ and $50b$ are illustrated in FIG. 8). Positioning is performed such that the central point of the area of a circuit pattern PA is aligned with an optical axis AX. The reticle stage 40 is arranged to be two-dimensionally moved by a motor (not shown) within a horizontal plane. Initial setting of the reticle 4 is performed by finely driving the reticle stage 40 on the basis of mark detection signals from reticle alignment systems (not shown) for photoelectrically detecting alignment marks around the reticle. The piezoelectric elements $50a$ to $50d$ are fixed on the reticle stage 40 at positions corresponding to the respective sides of the circuit pattern area. When the piezoelectric elements $50a$ to $50d$ expand or shrink to move a reticle 4 in the optical axis (z direction). At the same time, the reticle 1 can be two-dimensionally inclined from the horizontal plane with reference to the central point (optical axis AX) of the circuit pattern area. In addition, the reticle 4 can also be moved in the direction of the horizontal plane.

The chromatic aberration of a projection lens PL with respect to the wavelength (exposure wavelength) of illumination light IL is properly corrected. The reticle 4 and the wafer 5 are located conjugate with each other at this exposure wavelength. Note that the projection lens PL is a projection lens telocentric at one side in this embodiment. The x-y stage and the z stage of FIG. 1 are represented by a wafer stage 41 in FIG. 8. The drive units 8 and 6 in FIG. 1 are represented by a drive unit 42 in FIG. 8.

A reference member (glass substrate) 43 having fiducial marks used in image strain measurement (to be described in detail later) is formed on the wafer stage 41 so that the surface of the reference member 43 is identical to the surface position of the wafer 5. Although not illustrated in this embodiment, two light-transmitting slit patterns (bar patterns) extend as each fiducial mark in the y and x directions. A photoelectric detector 44 such as a PIN photodiode is arranged near the reference member 43 in the wafer stage 41. In this embodiment, the illumination light (exposure light) IL passing through the image strain measurement pattern (e.g., a light-transmitting cross pattern) is received by the photoelectric detector 44 through the slit pattern. In FIG. 8, the wafer stage has been shifted to the left, so that the projected image of the pattern on the reticle 4 is not focused on the wafer 5 but on the image strain measurement reference member 43.

A circuit pattern PA (or image strain measurement pattern to be described later) drawn on the photomask (reticle) 4 is illuminated from the above with the illumination light IL at an almost uniform illuminance. An image is then focused on the wafer 5 through the projection lens PL telocentric on one side.

A controller (CNT) 47 directly receives information from a console (CON) 48 for storing quantities associated with an image strain of each exposure apparatus and information associated with variation characteristics of an image strain corresponding to drive amounts of the lens elements or reticle, or another exposure apparatus (EXP) 49. The CNT 47 calculates drive amounts of piezoelectric elements 35a to 35c and 36a to 36c or the piezoelectric elements 50a to 50d for optimizing the image strain of each exposure apparatus on the basis of the input information and outputs the calculated drive amounts to a piezoelectric element driver circuit (PC) 46. The CON 48 also stores information associated with the presence/absence of a thin film (so-called pericle) for preventing foreign materials from attaching to the reticle and information associated with the types and thicknesses of pericles. These pieces of information serve as one of all basic data for driving the reticle 4 to control image strain amounts.

The PC 46 controls each piezoelectric element as in the main control system 17 of the first embodiment and outputs drive voltages on the basis of drive amounts of the piezoelectric elements 35a to 35c, 36a to 36c, and 50a to 50d. Although only one PC is illustrated in FIG. 8, a plurality of PCs may be used in accordance with the number of piezoelectric elements. As in the first embodiment, a position sensor such as a capacitive sensor, a differential transformer, or a strain gauge is desirably arranged near each piezoelectric element as in the first embodiment, thereby controlling the position of each piezoelectric element. The drive elements may be constituted by magnetostrictive elements except for the piezoelectric elements and may be driven by a motor to obtain the same effect as in the above embodiment.

This embodiment exemplifies an arrangement using both the means for driving the reticle 4 and the means for driving the optical elements of the projection lens PL, i.e., the lens elements 29, 30, and 32. However, one of these means can be used to obtain the same effect as described above. Detailed correction operations will be described later. In this embodiment, an image strain measurement reference member 43 and the photoelectric sensor (detector) 44 are sensors for measuring an image strain set by the above means. The CNT 47 confirms whether the measured image strain coincides with the set image strain.

The reticle 4 is an image strain measurement reticle (test reticle). A plurality of image strain measurement patterns are formed on the lower surface (pattern surface) of the lower surface in a 5×5 matrix. As the reticle 4, a device reticle having a plurality of image strain measurement patterns near the outside (i.e., an area corresponding to a scribing lines in a multi-die reticle) of the circuit pattern can be used in place of the test reticle. In this case, an alignment mark may also serve as the image strain measurement pattern. The positions and the number of measurement patterns may be determined in accordance with the required measurement precision.

In this embodiment, the reticle 4 is illuminated with the illumination light IL, and images of the reticle patterns (i.e., the image strain measurement patterns of the test or device reticle) are sequentially projected on the image strain measurement reference member 43 by driving the wafer stage 41. An amount of light transmitted through the reference member 43 and reaching the detector 44 is detected to detect whether the position of the image strain measurement pattern of the reticle 4 is focused on the image side of the projection lens PL, i.e., a given position on the conjugate plane of the reticle 4. That is, the relative positional relationship between the projected images of the image strain measurement patterns within the exposure field of the projection lens PL is detected. At this time, the position of the wafer stage 41 which holds the image strain measurement reference member 43 and the detector 44 is detected by the laser interferometer 13. This position information is transmitted to a signal processor (DSC) 45 together with the light amount signal from the detector 44. The DSC 45 samples the photoelectric signal in synchronism with an up/down pulse signal generated every unit movement amount (0.01 μm) of the wafer stage 41. The sampling values are converted into digital values and are stored in a memory (not shown) in an order of smaller addresses. Predetermined arithmetic processing is performed to calculate the position of the projected image of the pattern.

The position information (image strain information) of the projected images of the image strain measurement patterns from the DSC 45 is fed back to the CNT 47 to determine whether the piezoelectric elements 35a to 35c, 36a to 36c, and 50a to 50d are further driven.

A method of measuring image strain amounts described above is also disclosed in U.S. Pat. No. 4,629,313.

The relationship between the drive amounts of the reticle 4 or the lens elements 29, 30, and 32 and the change amounts of the optical characteristics (image strain or the like) of the projection lens PL, and the optical characteristics of the projection lens PL in the initial state can be obtained by using the test reticle (or the device reticle), the reference member 43, and the detector 44. Therefore, the above relationship and the optical characteristics of the projection lens need not be prestored in the CON 48. Alternatively, the above measurements are performed every predetermined interval or every time a sensor for monitoring a change in environment (e.g., a temperature, an atmospheric pressure, or a humidity) detects a change exceeding an allowable value. The information stored in the CON 48 may be sequentially updated. By this sequential updating, even if environmental changes, changes in optical characteristics of the projection lens PL caused by exposure absorption, and expansion of the reticle 4 are present, the magnification of the projection image of the reticle pattern and the image strain can be controlled with high precision.

In this embodiment, the image strain measurement patterns of the test reticle (or the device reticle) are illuminated with the illumination light IL from the upper direction of the reticle 4, and the projected images are focused on the reference member 44. However, as in the light-emitting fiducial marks FM in FIG. 1, a light source may be arranged on the side of the detector 44, and the slit pattern of the reference member 43 may be illuminated from the lower direction (i.e., from the inside of the wafer state). The formed images are focused on the image strain measurement patterns on the lower surface of the reticle 4. The light transmitted through the reticle 4 is received by the detector arranged on the upper surface of the reticle, thereby obtaining the same effect as described above. The light-receiving structure can facilitate the total arrangement when an arrangement of a light-receiving element is taken into consideration.

The following relationship is established between driving of the piezoelectric elements and changes in image strain characteristics. More specifically, when the piezoelectric elements are driven by vertically moving the reticle, the image strain shape is changed from a barrel shape to a hourglass shape or vice versa in the projection lens PL telocentric on both sides thereof. If the projection lens is telocentric on one side, the magnification is changed. When the reticle is to be inclined, the trapezoidal or rhombic image strain can be changed. On the other hand, when the piezoelectric elements are driven by vertically moving the lens elements, the image magnification is changed. When the lens element is inclined or moved in the horizontal direction, the trapezoidal or rhombic image strain can be changed. Note that the reference member 43, the detector 44, and the DSC 45 serve as means for detecting whether the actual image strain coincides with the set image strain. Even if these components are omitted, the effect of the second embodiment is sufficiently present.

An operation of this embodiment will be described with reference to FIG. 9.

Figure 9:
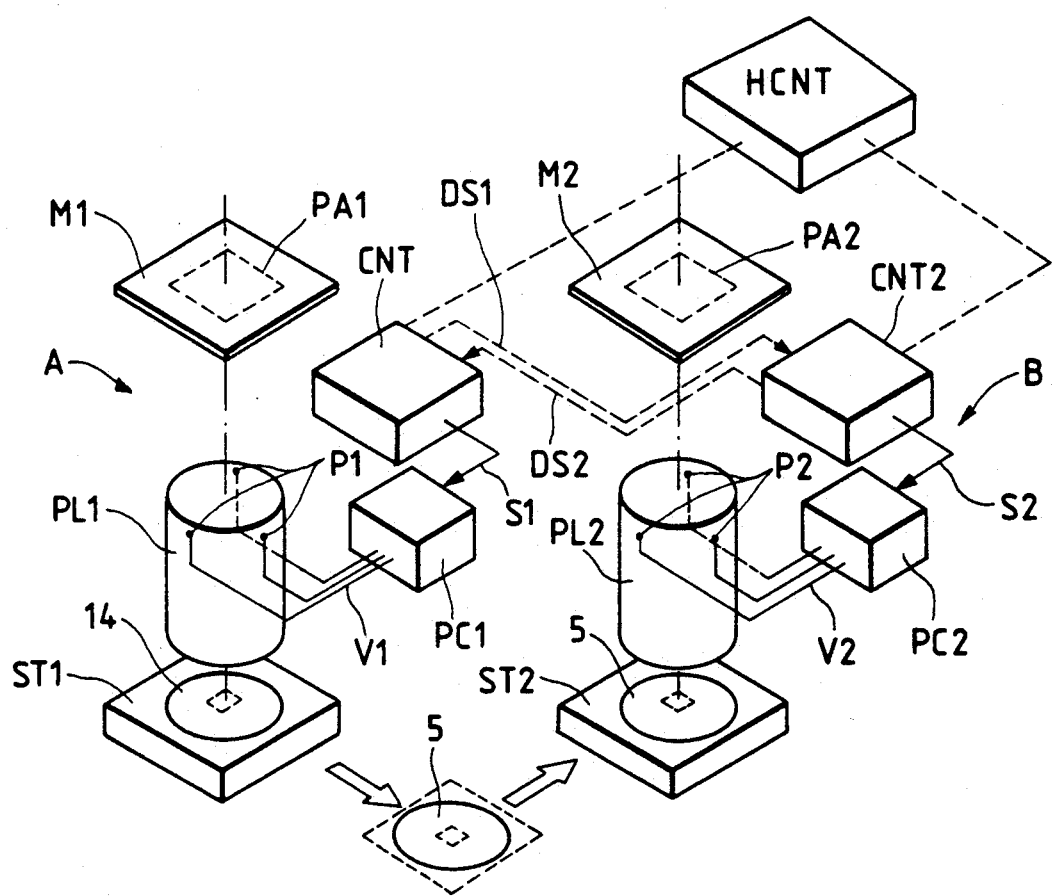
FIG. 9 is a view showing a combination of two projection exposure apparatuses employing the second embodiment of the present invention.

FIG. 9 is a view showing a state in which two projection exposure apparatuses employing the embodiment of the present invention are combined. A pattern PA1 of a reticle M1 is exposed on a wafer 5 by an apparatus A. Information DS1 associated with optical characteristics (amounts associated with image strain) in the reference state of a projection lens PL1 of the apparatus A is prestored in a controller CNT1. After the process, the wafer 5 exposed by the apparatus A is conveyed to the apparatus B, so that overlay exposure is performed.

Prior to this overlay exposure, the information signal DS1 associated with the optical characteristics of the projection lens PL1 of the apparatus A is transmitted from the controller CNT1 to the controller CNT2 of the apparatus B directly or through an external host controller HCNT. The controller CNT2 stores information DS2 associated with the optical characteristics of the projection lens PL2 of the apparatus B. Optimal drive amounts of the reticle M2 and the lens elements 29, 30, and 32 are obtained to match the optical characteristics of the projection lenses PL1 and PL2 of the apparatuses A and B on the basis of the information DS2 and the information DS1 input from the controller CNT1. A signal S2 associated with the driving amount of the piezoelectric element P2 corresponding to these driving amounts is output to a piezoelectric element controller PC2. The piezoelectric element controller PC2 outputs a drive voltage V2 to the piezoelectric element P2 on the basis of the signal S2, thereby driving the piezoelectric element P2. At this time, when the piezoelectric element P2 is driven while the positions of the reticle M2 or the lens elements 29, 30, and 32 are monitored on the basis of a signal from a position sensor, more accurate position control can be performed. Note that the driving amount of the piezoelectric element P2 may be determined by the external host controller HCNT.

After the optical characteristics of the projection lens PL2 are corrected upon driving of the piezoelectric element P2, a pattern PA2 of the reticle M2 is subjected to overlay exposure on the wafer 5. Prior to this exposure, the optical characteristics of the projection lens PL2 upon correction of the optical characteristics may be checked using the test reticle, the reference member 43, and the detector 44. Correction of the optical characteristics is not limited to the operation in which the characteristics of the apparatus B are matched with those of the apparatus A. The characteristics of the apparatus A may be matched with those of the apparatus B. Alternatively, both the optical characteristics of the apparatuses A and B are corrected to obtain optimal optical characteristics of both the apparatuses.

A piezoelectric element P1 is a drive member for correcting the optical characteristics of the apparatus A. The piezoelectric elements P1 and P2 may be mounted on some of the constituting members of the projection lenses PL1 and PL2 and the support members of the reticles M1 and M2. Reference symbols PC1, S1, and V1 represent a signal representing a drive amount of the piezoelectric element controller, a signal representing a drive amount of each piezoelectric element, and a drive voltage of each piezoelectric element of the apparatus A, respectively, and correspond to those of the apparatus B. Controllers CNT of three or more projection apparatuses may be connected directly or through the host controller HCNT, as shown in FIG. 9.

Figure 10:
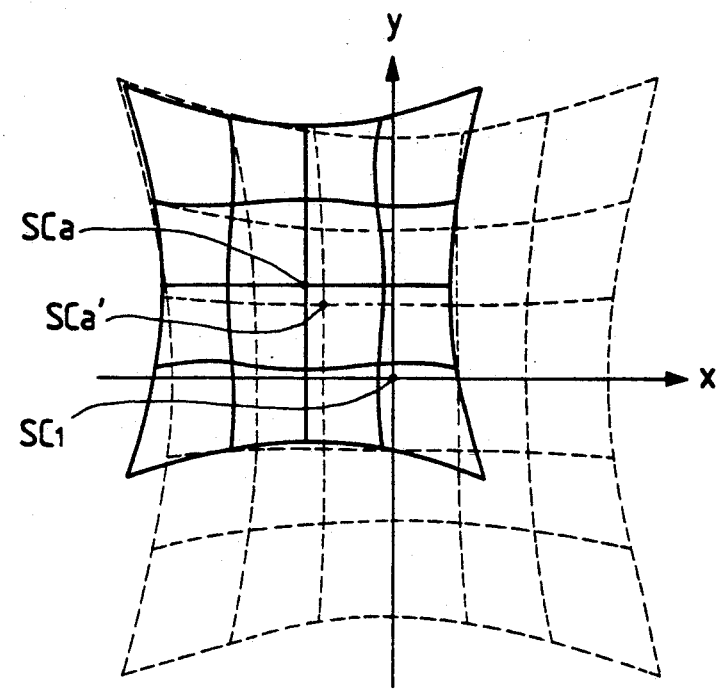
FIG. 10 is a view showing an image strain state of a circuit pattern when overlay exposure is performed while optical axes are not aligned with each other.

FIG. 10 is a view showing a state of an image strain (i.e., an isotropic image strain in this case) of a circuit pattern in overlay exposure when optical axes are not aligned with each other. Dotted lines represent characteristics associated with the image strain of the exposure apparatus used in the previous step. The position of the optical axis of the projection lens of the apparatus is SC1. Assume that of the areas indicated by the dotted lines, only the 4×4 block of the upper left corner is used in the previous exposure step. Other blocks are shielded and are not exposed. Assume that the exposure apparatus used in the previous step has a field size of 30×30 mm, and exposure is performed using a 20×20 mm area as part of this field size. Also assume that an exposure apparatus used in the current exposure step has a field size of 20×20 mm. An image strain state (shape) of the apparatus used in the current exposure step is indicated by solid lines. The position of the optical axis of this exposure apparatus is SCa. That is, the optical axes cannot be aligned due to the pattern layout on the reticle. As is apparent from FIG. 10, even if the shape of the image strain shape indicated by the solid lines is isotopically enlarged or reduced, or moved within the x-y plane with reference to the optical axis SCa, good circuit pattern matching cannot be expected. According to the method of the present invention, however, as in the case of FIG. 5, the image strain shape can be changed from that indicated by the solid lines to that indicated by the dotted lines. By utilizing this technique, higher overlay accuracy can be obtained, as will be briefly described below.

Figure 11:
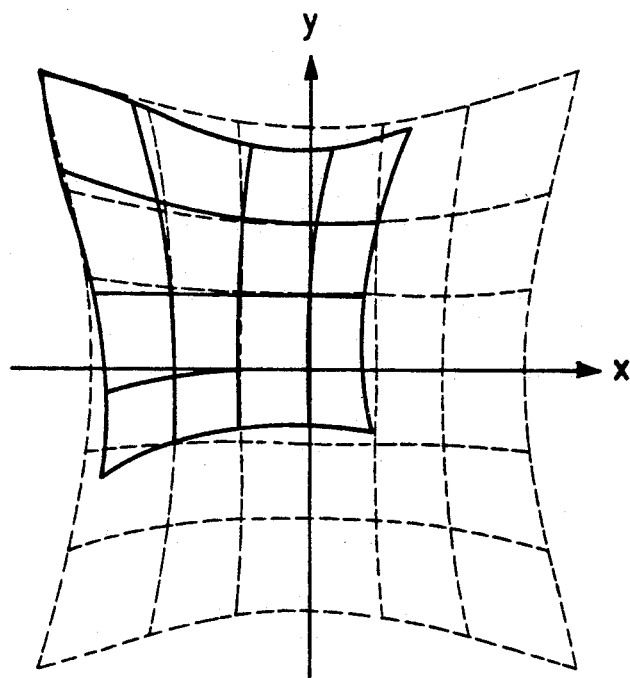
FIG. 11 is a view showing an image strain state showing circuit pattern overlay after the image strain is corrected according to the embodiment of the present invention.

Absolute values of differences between matrix points of overlay exposure area (FIG. 10) in the previous step and those in the current step are taken into consideration. For example, an absolute value of a distance between SCa and SCa, is assumed. The drive amounts of the image strain correction lenses or the drive amount of the reticle, and movement amounts of the respective matrix points are stored in the controller CNT or the host controller HCNT in the form of mathematical expressions or a table. Of these pieces of information, a drive amount of the correction lens element or the reticle for minimizing a maximum one of the absolute values of the differences of the corresponding matrix points, and lateral (x-y plane) shift amounts of the wafer stage for correcting the positional errors between the reticle and wafer upon driving of the lens elements and the reticle, and correction values of focal positions are calculated. As shown in FIG. 11, the strain shape is strained to a shape maximally conforming the image strain of the exposure apparatus in the previous step, thereby expecting good circuit pattern matching.

(Third Embodiment)

In the second embodiment, the reference member 43, the detector 44, and the signal processor 45 serve means for confirming whether the actual image strain coincides with the set image strain, or means for obtaining information supplied to the CON 48. However, in the third embodiment, prior to the exposure, a reference member 43, a detector 44, and a signal processor 45 are used to actually measure optical characteristics of a projection lens PL. Lens elements 29, 30, and 32 are driven on the basis of these pieces of image strain information, thereby correcting the anisotropic strains. This method is effective in adjustment of an exposure apparatus.

What is claimed is:

1. An exposure apparatus for exposing on a substrate a pattern formed on a mask, comprising:
    a projection optical system for forming the pattern on a predetermined focusing plane and projecting an image of the pattern on said substrate located to be substantially aligned with the focusing plane;
    driving means for three-dimensionally moving at least one of said mask and at least one of a plurality of optical members constituting said projection optical system, or for inclining said at least one of said mask and said at least one of said plurality of optical members with respect to a plane substantially perpendicular to an optical axis of said projection optical system; and
    correcting means for driving said driving means to anisotropically change optical characteristics of said projection optical system so that the projected image of the pattern is matched with a pattern already formed on said substrate.

2. An apparatus according to claim 1, wherein said driving means inclines said at least one of said plurality of optical members constituting said projection optical system with respect to the plane substantially perpendicular to the optical axis of said projection optical system.

3. An apparatus according to claim 1, further including
    measuring means for measuring an anisotropic deformation amount of the pattern formed on said substrate with respect to the projected image of the pattern focused on the focusing plane in accordance with predetermined optical characteristics of said projection optical system, and
    wherein said correcting means anisotropically changes the optical characteristics of said projection optical system on the basis of the measured anisotropic deformation amount.

4. An apparatus according to claim 3, further including arithmetic means for calculating the anisotropic deformation amount in accordance with a statistical arithmetic scheme.

5. An apparatus according to claim 4, wherein said arithmetic means calculates the anisotropic deformation amount in units of individual areas of said substrate.

6. An exposure apparatus for illuminating a mask having a pattern and exposing the pattern on a substrate, comprising:
    a projection optical system for forming the pattern on a predetermined focusing plane and projecting an image of the pattern on said substrate located to be substantially aligned with the focusing plane;
    driving means for three-dimensionally moving at least one of said mask and at least one of a plurality of optical members constituting said projection optical system, or for inclining said at least one of said mask and said at least one of said plurality of optical members with respect to a plane substantially perpendicular to an optical axis of said projection optical system;
    processing means for receiving first characteristic information associated with an anisotropic image strain of a projection optical system of an exposure apparatus which exposed a first pattern already formed on said substrate and second characteristic information associated with an anisotropic image strain of a projection optical system of an exposure apparatus to be used in a next step of performing overlay exposure of a second pattern on said substrate, and for calculating a drive amount of said driving means on the basis of the first characteristic information and the second characteristic information so that a difference between the image strains is relatively minimum; and
    position control means for driving said driving means on the basis of the movement amount obtained by said processing means.

7. An apparatus according to claim 6, further including:

measuring means, having a reference member located at a position substantially conjugate with said mask, for measuring an image strain of said projection optical system; and confirming means for confirming on the basis of the image strain amount measured by said measuring means whether control by said position control means is appropriate.

8. An apparatus according to claim 7, further including means for feeding back information from said confirming means to said position control means.

9. An apparatus for forming on a substrate an image of a pattern formed on a mask, comprising:

a projection optical system for forming the pattern on a predetermined focusing plane and projecting an image of the pattern on said substrate located to be substantially aligned with the focusing plane;

driving means for three-dimensionally moving at least one of said mask and at least one of a plurality of optical members constituting said projection optical system, or for inclining said at least one of said mask and said at least one of said plurality of optical members with respect to a plane substantially perpendicular to an optical axis of said projection optical system;

control means for adjusting an inner pressure of at least one space defined by said plurality of optical members; and correcting means for controlling said driving means combined with said control means to simultaneously change isotropic optical characteristics of said projection optical system and anisotropic optical characteristics of said projection optical system.

10. An exposure apparatus for exposing on a substrate a pattern formed on a mask, comprising:

a projection optical system for forming the pattern on a predetermined focusing plane and projecting an image of the pattern on said substrate located to be substantially aligned with the focusing plane;

driving means for three-dimensionally moving at least one of said mask and at least one of a plurality of optical members constituting said projection optical system, or for inclining said at least one of said mask and said at least one of said plurality of optical members with respect to a plane substantially perpendicular to an optical axis of said projection optical system; and correcting means for driving said driving means to correct a curvature of field of said projection optical system.

11. An apparatus according to claim 10, wherein said correcting means corrects the curvature of field of said projection optical system in accordance with warp of said substrate.

12. An apparatus for forming on a substrate an image of a pattern formed on a mask, comprising:

a projection optical system for forming the pattern on a predetermined focusing plane and projecting an image of the pattern on said substrate located to be substantially aligned with the focusing plane;

driving means for three-dimensionally moving at least one of said mask and at least one of a plurality of optical members constituting said projection optical system, or for inclining said at least one of said mask and said at least one of said plurality of optical members with respect to a plane substantially perpendicular to an optical axis of said projection optical system; and correcting means for driving said driving means to anisotropically change optical characteristics of said projection optical system.

13. An apparatus according to claim 12, further including:

measuring means, having a reference member located at a position substantially conjugate with said mask, for measuring an image strain of said projection optical system; and wherein said correcting means anisotropically changes the optical characteristics of said projection optical system on the basis of the image stain amount measured by said measuring means.

* * * * *